United States Patent
Hall et al.

(10) Patent No.: US 7,405,946 B2
(45) Date of Patent: Jul. 29, 2008

(54) BALL GRID ARRAY ASSIGNMENT

(75) Inventors: Jeffrey A. Hall, San Jose, CA (US);
Farshad Ghahghahi, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 291 days.

(21) Appl. No.: 11/122,370

(22) Filed: May 5, 2005

(65) Prior Publication Data
US 2006/0249302 A1 Nov. 9, 2006

(51) Int. Cl.
*H05K 7/00* (2006.01)

(52) U.S. Cl. .................. 361/783; 361/782; 361/792; 174/261

(58) Field of Classification Search ......... 174/255–266; 361/763, 767, 768, 777–780, 782, 783, 794, 361/795, 808
See application file for complete search history.

(56) References Cited

U.S. PATENT DOCUMENTS

| | | | |
|---|---|---|---|
| 7,069,646 B2 * | 7/2006 | Duxbury et al. | 29/830 |
| 7,095,107 B2 * | 8/2006 | Ramakrishnan et al. | 257/691 |
| 7,105,926 B2 * | 9/2006 | Ramakrishnan et al. | 257/773 |
| 2007/0001270 A1 * | 1/2007 | Sukegawa et al. | 257/664 |

* cited by examiner

*Primary Examiner*—Tuan T. Dinh
*Assistant Examiner*—Yuriy Semenenko
(74) *Attorney, Agent, or Firm*—Luedeka, Neely & Graham

(57) ABSTRACT

A pattern of contacts that includes high speed transmitter contacts disposed in a first portion of the pattern, where the high speed transmitter contacts are disposed in first ordered channels of adjacent transmitter differential pairs. High speed receiver contacts are disposed in a second portion of the pattern, where the first portion of the pattern is not interspersed with the second portion of the pattern, and the high speed receiver contacts are disposed in first ordered channels of adjacent receiver differential pairs. At least one unbroken line of other contacts is disposed between the first portion of the pattern and the second portion of the pattern, where the other contacts do not contain any high speed transmitter contacts and high speed receiver contacts. Low speed IO contacts are disposed in a third portion of the pattern. The first ordered channels are ordered to match an order of transmitter channels of a connector or another component on a printed circuit board to which the transmitter differential pairs are routed, and the second ordered channels are ordered to match an order of receiver channels of a connector or another component on a printed circuit board to which the receiver differential pairs are routed.

18 Claims, 1 Drawing Sheet

BALL GRID ARRAY ASSIGNMENT

FIELD

This invention relates to the field of integrated circuit fabrication. More particularly, this invention relates to ball grid array layout for integrated circuit packages.

BACKGROUND

Integrated circuits are operating at ever increasing speeds. For example, integrated circuits for markets such as communication and storage are often embedded with multiple cores that send and receive signals at speeds greater than about one gigabit per second, which is defined herein to be a high speed signal or a high speed device.

As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar.

Integrated circuits are typically formed into packaged devices with a package substrate. The package substrate provides all of the electrical connections to the integrated circuit, and provides separate electrical connections to another structure, typically referred to as the printed circuit board. Thus, as the terms are used herein, there are three different structure types used in an electrical circuit, which structures are the integrated circuit, the printed circuit board, and the interface between the integrated circuit and the printed circuit board, which is the package substrate. As contemplated herein, the integrated circuit does not at any time physically contact the printed circuit board, and the printed circuit board and the package substrate are physically separate elements that are manufactured at different times and using different processes.

The distinction between the printed circuit board and the package substrate is further exemplified by the time at which they are electrically connected to the integrated circuit. The package substrate is considered to be a part of the packaged integrated circuit, and the integrated circuit is typically not shipped from the integrated circuit manufacturer until it is assembled as a packaged device with the package substrate. However, the packaged substrate is typically assembled with the printed circuit board in a different facility at a later time by a purchaser of the packed integrated circuit. Thus, one skilled in the art is able to quickly distinguish between a printed circuit board and a package substrate.

For high speed integrated circuits, isolation between the transmitter and receiver pairs of the high speed signals and between the high speed signals and the other signals in the integrated circuit, package substrate, and printed circuit board is becoming a critical factor for ensuring the proper performance of the system. As a result, package designers strive to route integrated circuits so that the high speed signals are adequately isolated in the package substrate, and at the same time the package substrate design allows for adequate isolation in the printed circuit board. In addition, the package substrate design preferably enables routing of the high speed signals in the lowest possible number of printed circuit board layers, since this is a direct contributor to the overall cost of the system. High speed signals are those such as are implemented in Fibre Channel, Ethernet, PCI Express, Serial ATA, and SAS.

What is needed, therefore, is a system of routing high speed signals in a manner that overcomes problems and achieves goals, such as those described above, at least in part.

SUMMARY

The above and other needs are met by a pattern of contacts that includes high speed transmitter contacts disposed in a first portion of the pattern, where the high speed transmitter contacts are disposed in first ordered channels of adjacent transmitter differential pairs. High speed receiver contacts are disposed in a second portion of the pattern, where the first portion of the pattern is not interspersed with the second portion of the pattern, and the high speed receiver contacts are disposed in first ordered channels of adjacent receiver differential pairs. At least one unbroken line of other contacts is disposed between the first portion of the pattern and the second portion of the pattern, where the other contacts do not contain any high speed transmitter contacts and high speed receiver contacts. Low speed IO contacts are disposed in a third portion of the pattern. The first ordered channels are ordered to match an order of transmitter channels of a connector or another component on a printed circuit board to which the transmitter differential pairs are routed, and the second ordered channels are ordered to match an order of receiver channels of a connector or another component on a printed circuit board to which the receiver differential pairs are routed.

By configuring the contact pattern in this manner, better separation between the high speed transmitter contacts and the high speed receiver contacts is achieved, and the high speed signals are more easily routed out of the pattern. Not only are the high speed signals preferably near the edge of the pattern, but by ordering the channels according to the desired order of the connector or another component to which they are routed, additional layers for crossing the signal traces one over the other are not required. Thus, routing of the high speed transmitter signals and the high speed receiver signals is accomplished on only a single layer each in many embodiments.

In various embodiments, the other contacts are at least one of negative supply voltage or ground (VSS) contacts and positive supply voltage (VDD) contacts. In alternate embodiments, the ordered channels are ordered in a clockwise pattern, or in a counterclockwise pattern. In one embodiment, the first portion of the pattern is disposed in a peripheral portion of the pattern, the second portion of the pattern is disposed in an interior portion of the pattern, and the unbroken line of other contacts separates the peripheral portion of the pattern from the interior portion of the pattern. Alternately, the first portion of the pattern is disposed in an interior portion of the pattern, the second portion of the pattern is disposed in a peripheral portion of the pattern, and the unbroken line of other contacts separates the peripheral portion of the pattern from the interior portion of the pattern.

Also described are contact patterns such as those described above that are implemented in printed circuit boards and package substrates.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
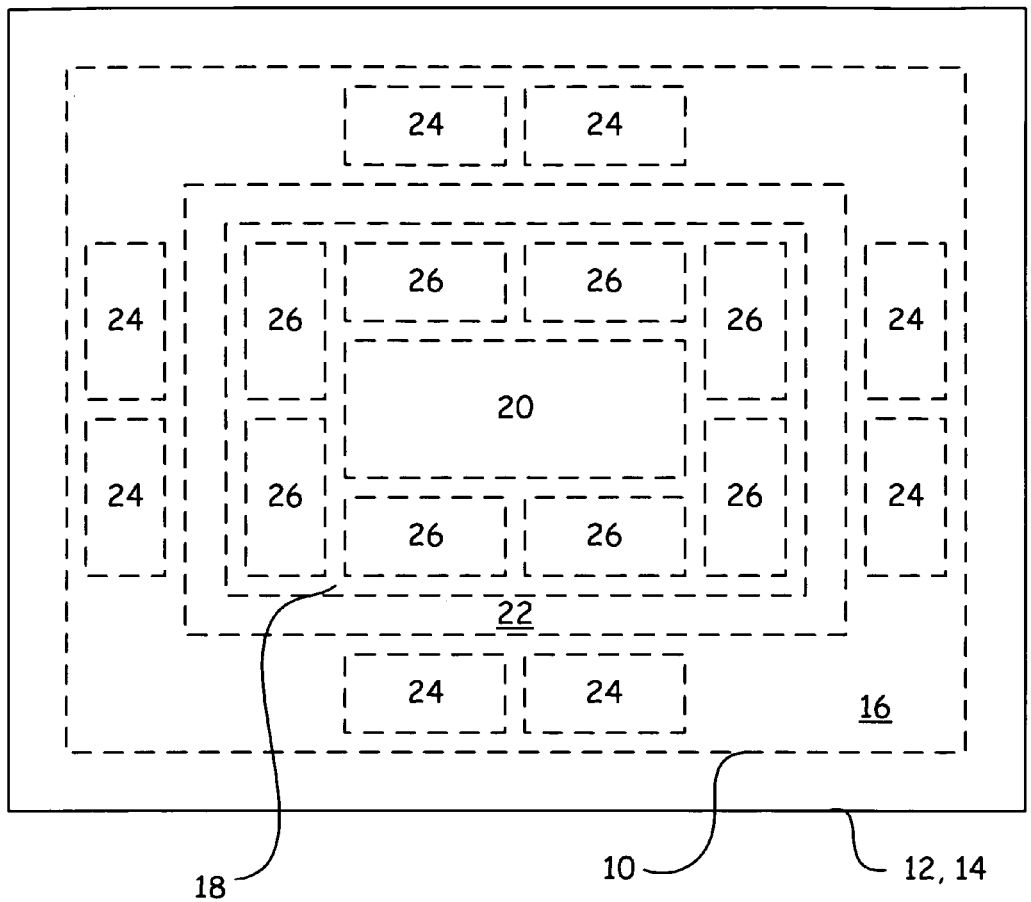
FIG. 1 is a contact placement pattern for transmitter and receiver pairs between a package substrate and a printed circuit board, according to a preferred embodiment of the invention.

With reference now to FIG. 1, there is depicted a contact placement pattern 10 for transmitter contacts and receiver contacts between a package substrate 12 and a printed circuit board 14, according to a preferred embodiment of the invention. As depicted in FIG. 1, the view is looking down on a portion of the contacts as they appear on either the package substrate 12 or the printed circuit board 14. Depending upon which of the package substrate 12 or the printed circuit board 14 is being viewed, it is appreciated that the contact placement pattern 10 for the other would be the mirror image of that depicted. The patterns described herein are particularly applicable to full area array and peripheral area array flip chip packaging technologies.

As can be seen in FIG. 1, one of the design elements of the pattern 10 is that all of the transmitter contacts are disposed in either the blocks 24 or 26, and are separated from all of the receiver contacts that are disposed in the other of the block 24 or 26, and are further separated by an unbroken line 22 of at least one of VSS contacts and VDD contacts. It is appreciated that the unbroken line 22 could be of just VSS contacts or just VDD contacts, or more than one unbroken line 22 of either or both of the VSS contacts and VDD contacts. However, in the preferred embodiment, there is just a single unbroken line 22 of both VSS contacts and VDD contacts, where the VSS contacts are interleaved one at a time with the VDD contacts. The unbroken line 22 provides electrical isolation between the transmitter contacts and the receiver contacts, which are preferably contacts for high speed signals, as defined elsewhere herein.

Most preferably, the receiver contacts for the high speed signals are disposed exclusively in the blocks 24, and the transmitter contacts for the high speed signals are disposed exclusively in the blocks 26. Also preferably, there is one transmitter block 26 associate with one transmitter block 24, and the associated blocks 24 and 26 are aligned one with another and disposed directly opposite each other across the unbroken line of contacts in region 22 of the pattern 10. Thus, the receiver blocks 24 are preferably disposed in the peripheral portion 16 of the pattern 10, and the transmitter blocks 26 are preferably disposed in the interior portion 18 of the pattern 10. Other contacts, such as power, ground, and signal for lower speed signals, are most preferably disposed in a third portion 20 the pattern 10.

Figure 2:
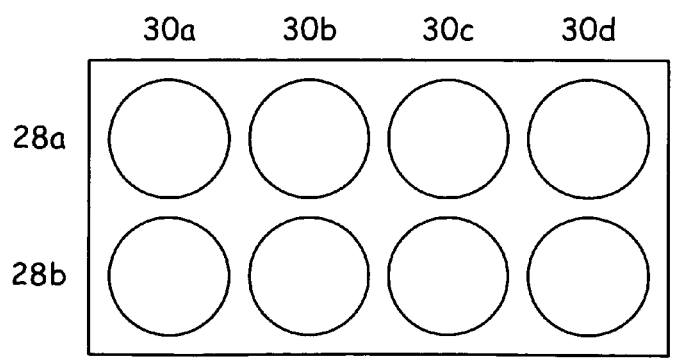
FIG. 2 is a contact placement pattern for either transmitter or receiver pairs between a package substrate and a printed circuit board, showing the placement of contacts for channels within the transmitter or receiver block, according to a preferred embodiment of the invention.

The transmitter contacts and the receiver contacts are preferably each grouped into differential pairs 28a and 28b, as depicted in FIG. 2. As given in FIG. 2, the differential pairs in rows 28a and 28b are also divided into four channels 30a, 30b, 30c, and 30d. There are preferably two contacts in each differential pair, but there may be more or less than four channels in each block of transmitters 26 and receivers 24. The contacts for the channels 30a, 30b, 30c, and 30d are preferably ordered such that they are in the same order as set in a connector or another component on the printed circuit board 14, to which the channels are routed. By providing the channels 30a, 30b, 30c, and 30d in this same order as the connector or another component, the traces that route out the channels do not need to be routed out to separate layers so that they can cross over one another so as to be in the proper order for the connector or another component on the printed circuit board 14. In this manner, all routing for the receivers can preferably be accomplished on a single layer, and all routing for the transmitters can preferably be accomplished on a single layer. This tends to reduce the number of layers required in the printed circuit board 14 that are required for routing out the high speed connections.

This ordering of the contacts is preferably continued on a larger scale, so that the blocks 24 and 26 are ordered according to where the connectors or other components for those blocks are located on the printed circuit board 14, so that no crossing over of signal traces for the high speed signals is required, and thus only a single layer of the printed circuit board 14 is required for the routing of each of the receiver signals and the transmitter signals. This ordering of channels and blocks can be done in either a clockwise or counterclockwise direction, as desired.

Most preferably, all of the receiver differential pairs are routed to the outermost two rows of ball pads in the pattern 10. All of the transmitter differential pairs are routed to the fourth and fifth rows in from the edge of the pattern 10. The third row of ball pads, between the receiver pairs and transmitter pairs, consists of an alternating pattern of power and ground ball pads. All of the receiver differential pairs are routed in order within each segment 30a, 30b, 30c, and 30d, clockwise around the package. All of the transmitter differential pairs are routed in order within each segment 30a, 30b, 30c, and 30d, clockwise around the package. All of the receiver differential pairs are routed on a separate layer of the printed circuit board 14 from the transmitter differential pairs.

This configuration has the following advantages: 1) The number of routing layers required on the printed circuit board 14 is greatly reduced. One application of this invention resulted in a reduction in layer count from sixteen routing layers to two routing layers. 2) Receiver and transmitter pairs are isolated from each other, both in their trace routing and ball grid array assignments, in order to maximize signal integrity.

Each of the segments 30a, 30b, 30c, and 30d is a different data channel. Placing them in the manner described allows the different data channels to route through a printed circuit board 14 directly into connectors or other components on the printed circuit board 14 without having to cross any of the channels 30a, 30b, 30c, and 30d over each other. This improves signal integrity and also reduces the number of printed circuit board 14 layers needed for routing. If, for example, the order of a transmitter segment is 0, 1, 3, 2 within a block 24 or 26, then the routing in the printed circuit board 14 needs to be such that by the time the signal traces in the printed circuit board 14 arrive at the connector or another component, they are ordered 0, 1, 2, 3. In order to switch the order of the segments labeled 2 and 3, one of the signals has to go down to another routing layer by way of a via so that it can switch positions with the other signal trace without physically shorting to it.

Another feature of the ball placement as described herein is to have the transmitter and receiver balls near the outside edge of the pattern 10. This again makes it easier for routing on the printed circuit board 14 that receives the packaged device. Using current industry standard design rules, the outer two rows of the pattern 10 are routed on the top layer of the printed circuit board 14. If the contacts are further inside the pattern 10, then extra layers are needed to route these signals from the center of the pattern to the outside in the printed circuit board 14.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A pattern of contacts comprising:
   all high speed transmitter contacts disposed in a first portion of the pattern, where the high speed transmitter contacts are disposed in first ordered channels of adjacent transmitter differential pairs,
   all high speed receiver contacts disposed in a second portion of the pattern, where the first portion of the pattern is not interspersed with the second portion of the pattern, and the high speed receiver contacts are disposed in second ordered channels of adjacent receiver differential pairs,
   at least one unbroken line of other contacts disposed between the first portion of the pattern and the second portion of the pattern, where the other contacts do not contain any high speed transmitter contacts and high speed receiver contacts, and
   all low speed IO contacts disposed in a third portion of the pattern,
   where the first ordered channels are ordered to match an order of transmitter channels of at least one of a connector and another component on a printed circuit board to which the transmitter differential pairs are routed, and the second ordered channels are ordered to match an order of receiver channels of at least one of a connector and another component on a printed circuit board to which the receiver differential pairs are routed.

2. The pattern of claim 1, wherein the other contacts comprise at least one of VSS contacts and VDD contacts.

3. The pattern of claim 1, wherein the first ordered channels are ordered in a circular pattern.

4. The pattern of claim 1, wherein the second ordered channels are ordered in a circular pattern.

5. The pattern of claim 1, wherein the first portion of the pattern is disposed in a peripheral portion of the pattern, the second portion of the pattern is disposed in an interior portion of the pattern, and the unbroken line of other contacts separates the peripheral portion of the pattern from the interior portion of the pattern.

6. The pattern of claim 1, wherein the first portion of the pattern is disposed in an interior portion of the pattern, the second portion of the pattern is disposed in a peripheral portion of the pattern, and the unbroken line of other contacts separates the peripheral portion of the pattern from the interior portion of the pattern.

7. A printed circuit board having a pattern of contacts comprising:
   all high speed transmitter contacts disposed in a first portion of the pattern, where the high speed transmitter contacts are disposed in first ordered channels of adjacent transmitter differential pairs,
   all high speed receiver contacts disposed in a second portion of the pattern, where the first portion of the pattern is not interspersed with the second portion of the pattern, and the high speed receiver contacts are disposed in second ordered channels of adjacent receiver differential pairs,
   at least one unbroken line of other contacts disposed between the first portion of the pattern and the second portion of the pattern, where the other contacts do not contain any high speed transmitter contacts and high speed receiver contacts, and
   all low speed IO contacts disposed in a third portion of the pattern,
   where the first ordered channels are ordered to match an order of transmitter channels of at least one of a connector and another component on a printed circuit board to which the transmitter differential pairs are routed, and the second ordered channels are ordered to match an order of receiver channels of at least one of a connector and another component on a printed circuit board to which the receiver differential pairs are routed.

8. The printed circuit board of claim 7, wherein the other contacts comprise at least one of VSS contacts and VDD contacts.

9. The printed circuit board of claim 7, wherein the first ordered channels are ordered in a circular pattern.

10. The printed circuit board of claim 7, wherein the second ordered channels are ordered in a circular pattern.

11. The printed circuit board of claim 7, wherein the first portion of the pattern is disposed in a peripheral portion of the pattern, the second portion of the pattern is disposed in an interior portion of the pattern, and the unbroken line of other contacts separates the peripheral portion of the pattern from the interior portion of the pattern.

12. The printed circuit board of claim 7, wherein the first portion of the pattern is disposed in an interior portion of the pattern, the second portion of the pattern is disposed in a peripheral portion of the pattern, and the unbroken line of other contacts separates the peripheral portion of the pattern from the interior portion of the pattern.

13. A package substrate having a pattern of contacts comprising:
   all high speed transmitter contacts disposed in a first portion of the pattern, where the high speed transmitter contacts are disposed in first ordered channels of adjacent transmitter differential pairs,
   all high speed receiver contacts disposed in a second portion of the pattern, where the first portion of the pattern is not interspersed with the second portion of the pattern, and the high speed receiver contacts are disposed in second ordered channels of adjacent receiver differential pairs,
   at least one unbroken line of other contacts disposed between the first portion of the pattern and the second portion of the pattern, where the other contacts do not contain any high speed transmitter contacts and high speed receiver contacts, and
   all low speed IO contacts disposed in a third portion of the pattern,
   where the first ordered channels are ordered to match an order of transmitter channels of at least one of a connector and another component on a printed circuit board to which the transmitter differential pairs are routed, and the second ordered channels are ordered to match an order of receiver channels of at least one of a connector and another component on a printed circuit board to which the receiver differential pairs are routed.

14. The package substrate of claim 13, wherein the other contacts comprise at least one of VSS contacts and VDD contacts.

15. The package substrate of claim 13, wherein the first ordered channels are ordered in a circular pattern.

16. The package substrate of claim 13, wherein the second ordered channels are ordered in a circular pattern.

17. The package substrate of claim 13, wherein the first portion of the pattern is disposed in a peripheral portion of the pattern, the second portion of the pattern is disposed in an interior portion of the pattern, and the unbroken line of other contacts separates the peripheral portion of the pattern from the interior portion of the pattern.

18. The package substrate of claim 13, wherein the first portion of the pattern is disposed in an interior portion of the pattern, the second portion of the pattern is disposed in a peripheral portion of the pattern, and the unbroken line of other contacts separates the peripheral portion of the pattern from the interior portion of the pattern.

* * * * *